United States Patent [19]

Voisin et al.

[11] Patent Number: 4,806,993
[45] Date of Patent: Feb. 21, 1989

[54] METHOD AND DEVICE FOR RAPID PHOTO-DETECTION BY MEANS OF A SUPER-LATTICE

[75] Inventors: Paul Voisin; Jose A. Brum, both of Paris, France

[73] Assignee: Centre National de la Recherche Scientifique (C.N.R.S.), Paris, France

[21] Appl. No.: 902,926

[22] Filed: Sep. 2, 1986

[30] Foreign Application Priority Data

Aug. 30, 1985 [FR] France ................. 85 12970

[51] Int. Cl.$^4$ .............................. H01L 27/12
[52] U.S. Cl. ........................... 357/4; 357/16; 357/30
[58] Field of Search .......... 357/4 SL, 16, 30 B, 357/30 E, 30 G, 30 R, 30 M, 4, 30 I

[56] References Cited

U.S. PATENT DOCUMENTS

| 2,560,606 | 7/1951 | Shive | 357/30 M X |
| 4,278,474 | 7/1981 | Blakeslee et al. | 357/30 X |
| 4,348,686 | 9/1982 | Esaki et al. | 357/30 |
| 4,645,707 | 2/1987 | Davies et al. | 357/4 SL X |
| 4,694,116 | 9/1987 | Hayashi et al. | 357/30 R X |

FOREIGN PATENT DOCUMENTS 0133342 2/1985 European Pat. Off. .
0139505 5/1985 European Pat. Off. .

OTHER PUBLICATIONS

Capasso et al, "New Transient Electrical Polarization Phenomenon in Sawtooth Superlattices", *Physical Review Letters*, vol. 51, No. 25, 19 Dec. 1983, pp. 2318-2321.
Agusta, "Light to Voltage Converter", *IBM Technical Disclosure Bulletin*, vol. 9, No. 2, Jul. 1960, pp. 219-220.
Döhler, "Doping Superlattices", *J. Vac. Sci. Technol.*, 16131, May/Jun. 1979, pp. 851-856.

Primary Examiner—Andrew J. James
Assistant Examiner—William A. Mintel
Attorney, Agent, or Firm—Toren, McGeady & Associates

[57] ABSTRACT

To detect a temporal variation, in particular an ultrashort pulse, in a beam of electromagnetic radiation, this beam is applied to a super-lattice of type II, along its axis of growth, and the voltage between the opposite sides of the network along the same axis is determined. The super-lattice is preferably a composite super-lattice, in particular, with alternate layers of indium arsenide and of gallium antimonide. The method is, in particular, applied in the infrared range.

19 Claims, 6 Drawing Sheets

METHOD AND DEVICE FOR RAPID PHOTO-DETECTION BY MEANS OF A SUPER-LATTICE

FIELD OF THE INVENTION

The present invention concerns semiconductor super-lattices.

PRIOR ART

Semiconductor super-lattices have, in particular, been the object of the following publications:
L. Esaki and R. Tsu IBM Journal of Research and Development, 14, 61 (1970).
L. Esaki and L. L. Chang, Phys. Rev. Lett. 33, 495 (1974).
R. Dingle et al., Phys. Rev. Lett. 33, 827 (1974).
R. Dingle, in Festkörper XV, edited by H. J. Queisser, Pergamon Vieweg, 1975, p.21.
L. Esaki and L. L. Chang. Journal of Magnetism and Magnetic Materials 11, 208 (1979).
L. Esaki, Journal of Crystal Growth, 52, 2277 (1981) and Surf. Sci., 113, No. 1-3 (1982).

The mathematical tools for their analysis have, moreover, been defined in particular in the following publications:
G. A. Sai Halaz, L. Esaki and W. A. Harrison, Phys.-Rev. B 18, 2812 (1978).
G. Bastard, Phys. Rev. B 24, 5693 (1981) and B 25, 7584 (1982).
M. Altarelli, Phys. Rev. B, 28, 842 (1983).

Briefly, a super-lattice is a semiconductor structure wherein there appear along one of its axes (termed below the axis of growth), periodic variations of the lower limit of the conduction band and of the upper limit of the valence band. In other words, a periodic variation is produced of the width of the forbidden band along the axis of growth.

The "waveform" of this periodic variation is most frequently very straightforward, at least in theory. Thus one may distinguish:
super-lattices wherein the periodic variation has a rectangular shape, such as the heterostructures obtained by the alternation of gallium arsenide (GaAs) and aluminumgallium arsenide ($Al_xGa_{1-x}As$) layers, studied in particular by Esaki et al. (1974), Dingle et al. (1975) or also heterostructures of indium arsenide and of gallium antimonide (InAs-GaSb) studied by Esaki (1978 and 1982);
the super-lattices where this periodic variation assumes on the whole a sinusoidal shape, such as NIPI doped superlattices studied by G. H. Döhler et al. Phys. Rev. B 27, 3538 (1983);
the "saw-tooth" super-lattices studied in particular by Capasso et al., Phys. Rev. Lett. 51, 2318 (1983).

One of the advantageous properties of super-lattices is that they form centers of concentration of the charge carriers: electrons in the wells of potential of the conduction band, that is to say in the "hollows" of the lower limit of the conduction band; holes in the wells of potential of the valence band, that is to say, in the "humps" of the upper limit of the valence band.

This has led to a new classification:
The super-lattices are termed super-networks of type I wherein the hollows and the humps subject to the said concentration are found substantially at the same points along the axis of growth ($GaAs-Al_xGa_{1-x}As$).

The super-lattices of type II are, on the contrary, those wherein the hollows (concentration of the electrons) and the humps (concentration of the holes) appear at different alternate points along the axis of growth (InAs-GaSb), doped super-lattices).

OBJECT OF THE INVENTION

It is an object of the present invention to provide a new transient photovoltaic effect which appears in the Type II super-lattices and which is such as to allow the making of a rapid infrared photodetector.

It is a further object to provide a method for detecting a temporal variation, in particular, an ultrashort pulse in a beam of electromagnetic radiation.

SUMMARY OF THE INVENTION

The invention provides a method for detecting a temporal variation, in particular, in an ultrashort pulse in a beam of electromagnetic radiation, characterized by the operations of (a) applying the beam to a type II super-lattice along its axis of growth; and (b) determining the voltage between the opposite sides of the super-lattice along the same axis.

The invention applies, in particular, when the super-network is a composite super-lattice.

At present, such super-lattices are formed by compounds of semiconductors III-V, or alloys of the latter.

In practice, the composite super-lattices are periodic laminates of the layers of two different compounds.

It is advantageous to choose these compounds so that the lower limit of the conduction band of one of the compounds should be lower than the upper limit of the valence band of the other compound, which makes it possible to choose the width of the forbidden band of the super-lattice by way of design, as will be seen below.

In a particularly advantageous mode of the embodiment, one of the compounds is indium arsenide (In As) and the other, gallium antimonide (Gs Sb). One may also envisage using alloys of such compounds.

For its part, the thickness of the layer is, in principle, less than approximately 300 angströms, and preferably less than approximately 200 angstroms, in particular, for the InAs-GaSb super-lattices.

As a general rule, the thicknesses of the one compound and of the other are substantially equal to within an approximate factor of 2. Thus, the method may be implemented with a layer thickness of approximately 30 anstroms for the indium arsenide and 50 angstroms for the gallium antimonide.

Although doping does not play a direct part, it is desirable that it should remain at as low a level as possible. In practice, the indium arsenide and the gallium antimonide contain residual n and p type dopants, respectively.

The laminate constituting a super-lattice may comprise approximately 100 pairs of layers for a total thickness of one or several micrometers along its axis of growth.

As a variant, the super-lattice can also be a doped lattice of the type termed "NIPI", that is to say, comprising an alternation of heavily doped n zones and heavily doped p zones with or without interposition of intrinsic semicondutor layers attaching originally to the term "NIPI".

In accordance with another aspect of the invention, the super-lattice is given an overall asymmetry of reflection along the direction of growth in relation to the incident beam of electromagnetic radiation.

This overall asymmetry of reflection may be at least partly geometrical in origin, for instance, in that the super-lattice exacty comprises an integral number of spatial periods (pairs of layers).

The overall asymmetry of reflection may also be in part due to the absorption of light in the layers of the super-lattice.

The invention also concerns a device for detecting a temporal variation, in particular an ultrashort pulse in a beam of electromagnetic radiation. The device comprises a type II super-lattice, such as defined above, means for focussing the incident beam, so that it is produced substantially along the axis of growth of the super-lattice and measuring means sensitive to the potential difference obtaining between the opposite sides of the lattice along its axis of growth.

The super-lattice is, for instance, formed on a substrate rendered conductive by strong doping and obtained by the technique called molecular beam epitaxy.

A super-lattice in accordance with the invention has a rapid response to the rising front of a light pulse. The photoelectric signal then decreases more slowly. The time constant of the decrease may, moreover, vary slightly according to whether the transition which has produced it is a transition from a non-illuminated state to an illuminated state, or, on the contrary, from an illuminated to a non-illuminated state.

Moreover, the impedance created by the measuring means between the opposite sides of the super-lattice may be adjusted to define the time constant of the decrease in response of the device to the transitions of electromagnetic radiation, of course insofar as it is desired to shorten this time constant.

According to another aspect of the invention, where one uses a super-lattice such as those of an of InAs/-GaSb composition, the periodic arrangement of the laminating of the super-lattice may be chosen so as to render it sensitive to a predetermined wavelengths band of the incident radiation.

Finally, the invention concerns any application of a type II super-lattice, in particular of a composite In As/Ga Sb super-lattice, to transient photovoltaic measurements, in particular of ultra short pulses in the infrared range.

BRIEF DESCRIPTION OF THE DRAWINGS

Other characteristics and advantages of the invention will emerge on examining the following detailed description and the attached drawings wherein.

BRIEF DESCRIPTION OF THE PREFERRED EMBODIMENTS

Figure 1:
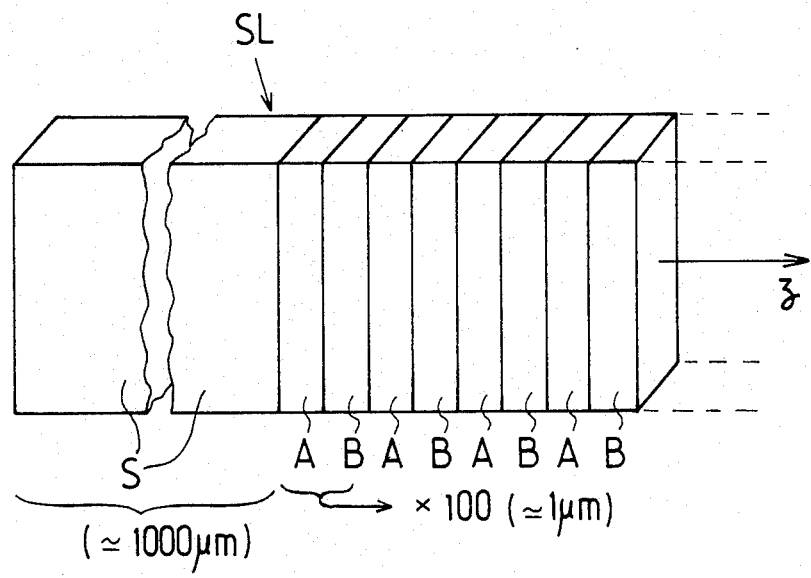
FIG. 1 is a greatly simplified diagram in perspective of a composite super-lattice.

In FIG. 1, the super-lattice SL is constituted by a substrate S whose thickness is of the order of a fraction of one millimeter. On this substrate, alternate layers of materials A and B are caused to grow, for instance, by epitaxy with molecular jets and this along a direction of growth marked z. Since the drawing is not to scale, it shall be assumed that the super-lattice comprises about one hundred pairs of layers A and B forming an overall thickness of one micrometer.

The fabrication of super-lattices uses advanced techniques and it is very delicate since many factors intervene. One of these factors is the dimension of the crystal lattices normally comprised in the two materials A and B of the laminate. The nature of the materials which can be used is still relatively limited, because of the problems of evaporation, adhesion and of crystal reconstruction which may occur when epitaxy is used.

First of all, super-lattices were made whose laminate structure consists alternately of layers of gallium arsenide (Ga As) and of a gallium/aluminum/arsenide alloy usually designated $Ga_{1-x}Al_xAs$.

Figure 2:
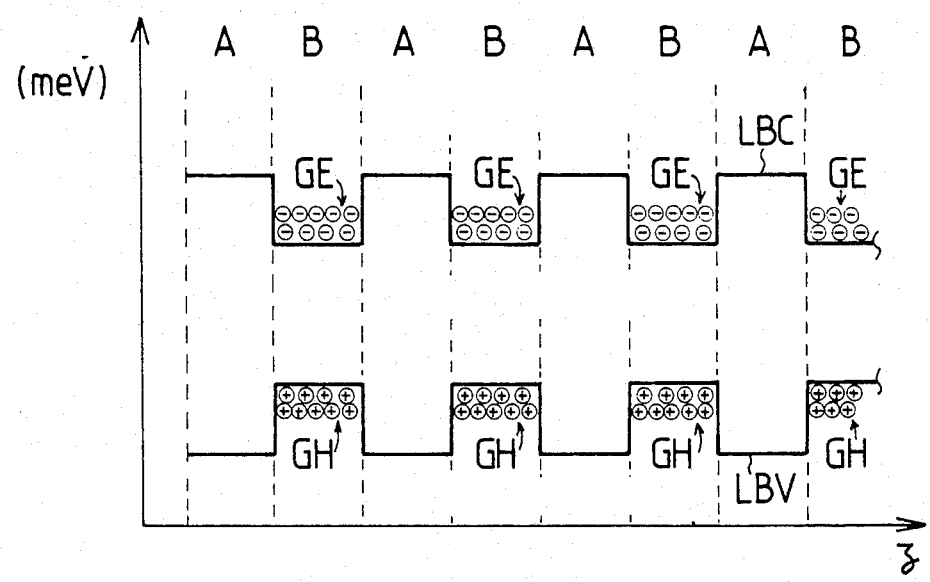
FIG. 2 illustrates the relative disposition of the conduction and valence bands in a type I super-lattice such as $GaAs-Al_xGa_{1-x}As$.

The expert knows that in such a super-lattice, the limits of the conduction band and of the valence band are defined by square wave plots designated LBC and LBV in FIG. 2. In FIG. 2, the abscissae represent the z direction of the axis of growth, while the ordinates are energies usually measured in milli-electron volts (meV).

In a type I super-lattice as illustrated in FIG. 2, potential wells will be observed constituted by the hollows of the LBC limit of the conduction band. The charge carriers concerned, that is to say, the electrons, will preferentially establish themselves in the potential wells. Thus the drawing represents a cloud of electrons GE at the bottom of each one of the potential wells. This is a simplification because in a super-lattice, quantization of the energy levels which can be taken up by the electron, will occur. In other words, one says that there exist "sub-bands" in the conduction band.

Similarly, a cloud of positive charge carriers or holes will be observed in each one of the wells of the valence band. These clouds of holes are designated GH. And, taking the inversion of the signs into account, the quantum wells of the valence band are defined by the humps of the latter in a representation such as that of FIG. 2.

The forbidden band of such a super-lattice is the gap between the basic conduction and valence sub-bands.

The super-lattice of FIG. 2 is type I, because the clouds of electrons GE and of the holes GH are at the same points along the direction of growth z.

It is different in a type II super-lattice, as will now be seen with reference to FIG. 3.

Figure 3A:
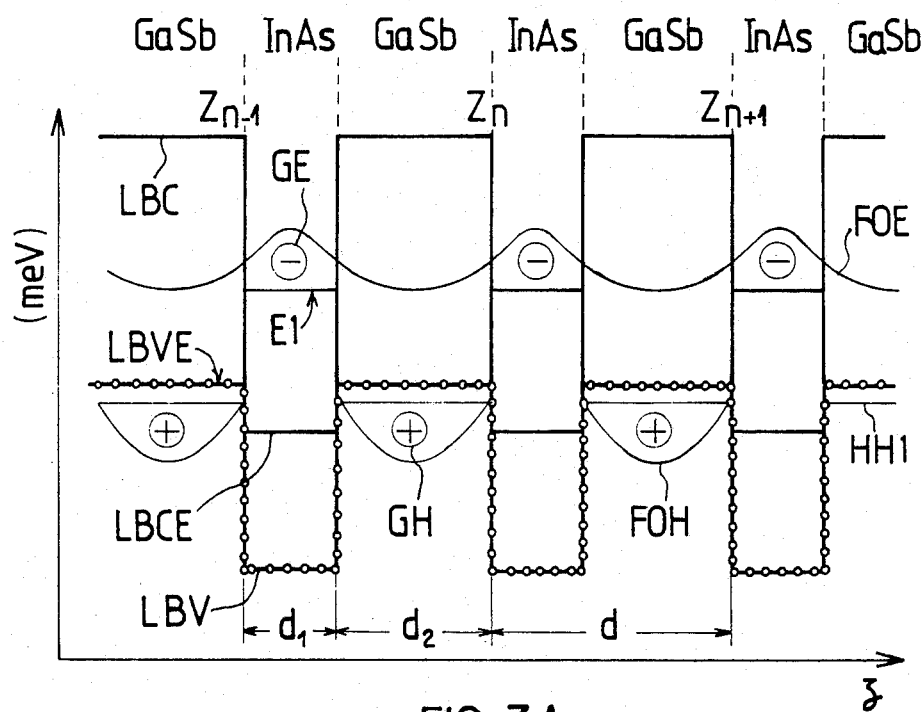
FIG. 3A illustrates the disposition of the conduction and valence bands in a type II super-lattice used in accordance with the invention.

The super-lattice of FIG. 3A is an alternate laminate of layers In As and Ga Sb, of respective thicknesses $d_1$ and $d_2$. The period d of the lattice is designated d, with $d=d_1+d_2$. The limits of each pair of layers will also be given a designation of $z_{n-1}$, $z_n$, and $z_{n+1}$, which here commences when passing from Ga Sb to In As, thus defining the elementary cell of the super-lattice.

The type II super-lattice of FIG. 3A has two particular features:

the first, related to its belonging to type II, is that the LBC and LBV square wave plots appear "in phase", that is to say, that the hollows of the LBC square wave plot (the quantum wells of the conduction band) alternate with the humps of the LBV plot (the quantum wells of the valence band);

moreover, the lower extremes LBCE of the limit of the conduction band LBC are lower than the upper extremes LBVE of the limit of the valence band LBV. It follows therefrom that the LBC and LBV plots overlap. The reading of FIG. 3A is facilitated in that the LBV line is marked by regularly interspaced points.

The first observation made above has the result that the privileged concentrations of electrons GE alternate with privileged concentrations of holes GH along the z axis. In FIG. 3, a schematic illustration has been shown of the probability of the presence FOE of electrons along the z axis (square modulus of the wave function $\psi_e(z)$) and similarly FOH for the probability of the presence of holes along the z axis (modulus of the wave function $\psi_h(z)$, squared).

It is now recalled that quantization applies, that is to say, there are sub-bands in a super-lattice.

Thus, FIG. 3A shows the level $E_1$ of the basic state of the electron in the quantum wells of the limit LBC of the conduction basnd.

Similarly, the level $HH_1$ of the basic state of the holes (heavy, as will be seen below), will be observed in the quantum wells of the limit LBV of the valence band.

Figure 4:
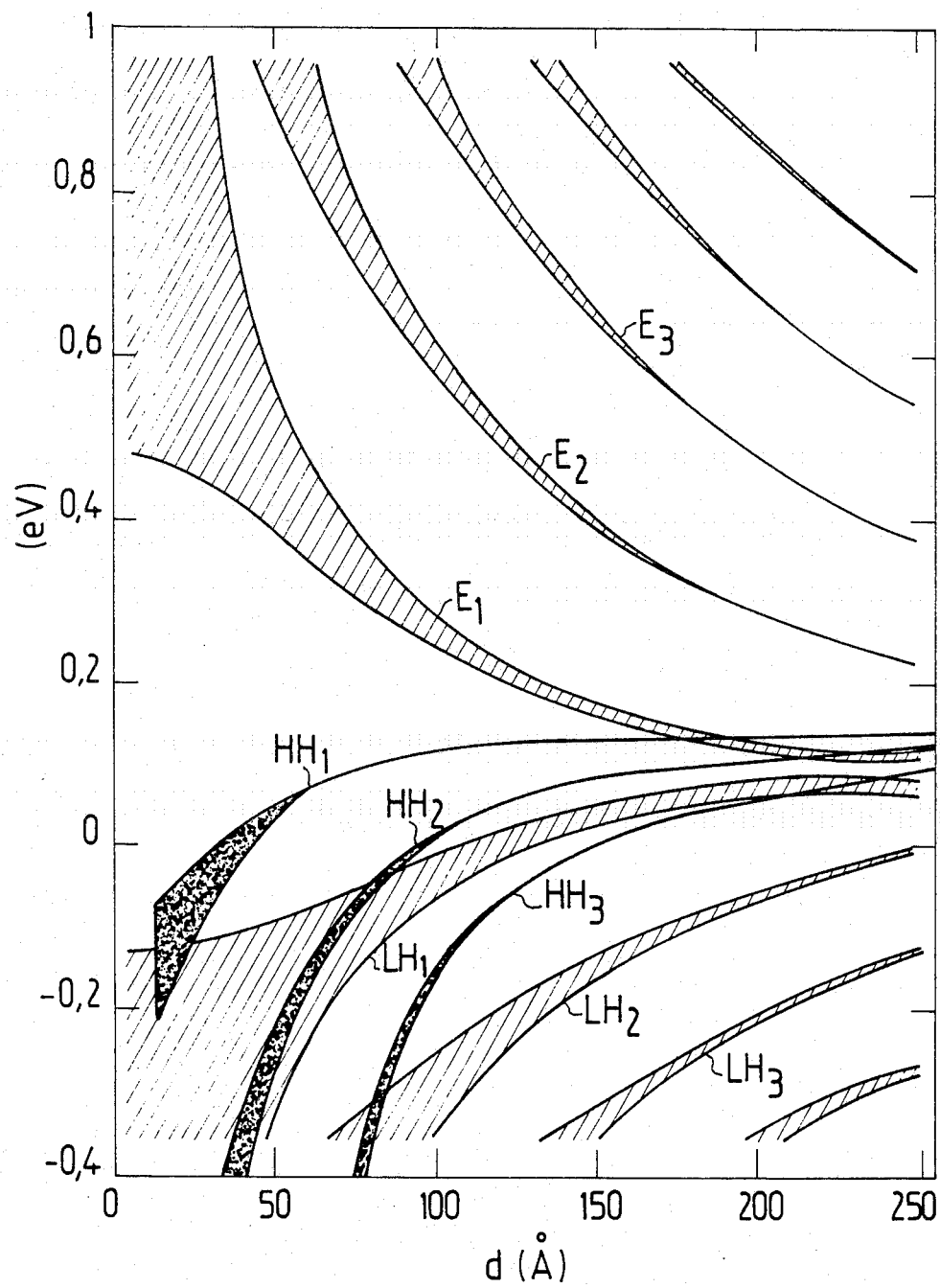
FIG. 4 is a diagram representing the permitted energy bands in relation to the period for an InAs/GaSb super-lattice where the thicknesses of the two layers are equal.

The second property of the In As-Ga Sb super-lattices will be better understood on examining FIG. 4. The latter comprises period d of the super-lattice expressed in angstroms along the x axis. Along the y axis, it is graduated in energy (electronvolts). The graph corresponds to the case where thicknesses $d_1$ and $d_2$ are equal.

In this FIG. 4, the area designated $E_1$ illustrates the size of the basic sub-band of the quantum wells of the conduction band. The area $E_2$, $E_3$, etc., illustrates the sizes of the higher order sub-bands. It will be seen that these areas thin out very rapidly to terminate in a single line when period d increases towards 250 angstroms.

The $HH_1$ curve illustrates the basic sub-band in the quantum wells of the valence band for the heavy holes. The $HH_2$, etc., areas illustrate the higher order sub-bands.

Finally, the $LH_1$ area illustrates the first sub-band of the quantum wells of the valence band for light holes and the $LH_2$ and following areas illustrate the higher order sub-bands.

It is not necessary to develop here the difference between heavy and light holes. This difference is set out in the articles cited at the beginning of the description.

In point of fact, it suffices to accept that the super-lattice is, in its state termed "limite electrique quantique" (in English, Electric quantum Limit or EQL) wherein only the basic sub-bands of the conduction band and of the valence band are occupied. It is, then, the $E_1$ and $HH_1$ sub-bands which are essential for defining the state of the super-lattice.

FIG. 4 also shows an advantageous characteristic of the In As-Ga Sb lattices related to the fact already noted that LBVE is higher than LBCE. In point of fact, by selecting the period d of the lattice, one defines at will the distance between the zones $HH_1$ and $E_1$, that is to say, the width of the forbidden band.

For instance:

the width of the forbidden band is a few milli-electronvolts for a period of the super-lattice of 150 angstroms; beyond this, it has been demonstrated that the forbidden band increases again in spite of the apparent crossing of layers $E_1$ and $HH_1$ (Altarelli's article already cited);

this width of the forbidden band does, on the contrary, increase to some hundreds of milli-electron volts when the period d of the lattice falls to approximately 60 angstroms.

The behavior of such super-lattices is quite astonishing and has already formed the object of many studies.

It has, in particular, been observed that there occurs a periodic curving of the bands because of the spatial separation of the charge carries (electrons and holes). But it has become apparent that this phenomenon could not, on its own, explain all the observations made with the super-lattices. Besides, one is here essentially concerned with a photo-induced effect which is continuous, contrary to the transient photo-electric effect which will be described below.

Studies effected by the assignees of the present invention have shown, first of all, that if a voltage generated in an elementary cell of the super-lattice is termed $\Delta v$ for instance, between the abscissae $z_n$ and $z_{n+1}$, there occurs a phenomenon of addition when an injection of charge carriers is applied to the super-lattice. That is to say, when the voltage $\Delta V$ existing at the terminals of the super-lattice as a whole is equal to N times the voltage $\Delta v$, as recalled in equation (1) in the Annex, N being the number of periods comprised in the super-lattice.

The specialists have taken a rather long time to perceive this situation, which is, nevertheless, apparently simple.

As has already been explained, it will now be considered that the super-lattice is in its electric quantum limit state, that is to say, that only the conduction and valence sub-bands are occupied. $\psi_e(z)$ designates the wave function envelope relating to the electrons which is centered in relation to the indium arsenide layer. (The approximations of the wave function envelopes have been described in G. Bastard's articles cited above).

It will be observed that the wave functions of the electron extend somewhat into the adjacent gallium antimonide layers (see in FIG. 3A the FOE curve which represents $|\psi_e(z)|^2$.).

Similarly, $\psi_h(z)$ designates the wave function envelope associated with the heavy holes. The square of its modulus, that is to say, the FOH curve is illustrated negatively in relation to the FOE curves of the electron according to a natural convention. it will also be observed that the wave function $\psi_h(z)$ is centered on the gallium antimonide layer.

This spatial separation of the wave functions of the electrons and holes corresponds to a local polarization which induces an overall potential difference $\Delta v$ at the terminals of the super-lattice. As set out in equation 1, $\Delta v$ is equal to the sum of the local potential differences $\Delta v$ between the planes $z=z_n$ and $z=z_{n+1}$ limiting the $n^{th}$ unitary cell.

The expert will understand that in a unitary cell, the potential difference $\Delta v$ may be defined by equation 2 given in the annex, where:

e is the charge of the electron, $n_s$ is the number of charge carriers injected per unit of surface, (more exactly of electron-hole pairs), $\epsilon$ and $\epsilon_0$ are the usual dielectric constants, and $z$, $z'$, $dz$ and $dz'$ are the usual symbols of the integration variables.

Relation (2) defines the integral of the difference between the probabilities of the presence of electrons and of holes, firstly over a fraction of a unitary cell extending from its up line terminal as far a current value z, whereupon a fresh integration is effected for z varying from the one to the other limit of the unitary cell.

Equation (2) implicity brings in the conditions at the limits, which ensure that the electric field fades outside a dipolar bi-dimensional charge distribution.

Figure 3B:
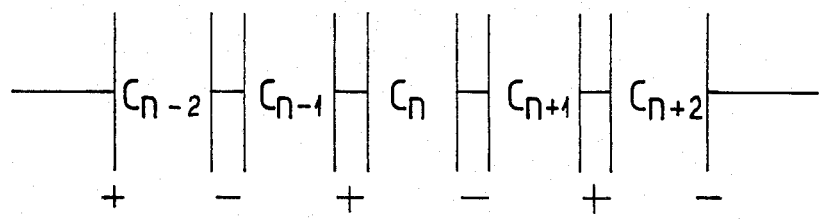
FIG. 3B is a diagram showing an analogy by way of a cascade arrangement of capacitors, allowing the present invention to be more readily understood.

It is now becoming clear that the system may be considered as an assembly of capacitors in series, each associated with one period of the super-lattice, the positive plate of the said capacitors is situated at the level of the mean value at z of the wave function of the holes, and whose negative plate is at the mean value at z of the wave function of the electrons. This is illustrated in FIG. 3B, where the capacitors designated $C_{n-2}$ to $C_{n+2}$ are shown.

Work carried out by the assignees of this invention has made it possible to verify that, if the wave functions are normalized over the segment $z_n$, $z_{n+}$, the double integral of the equation (2) may be written in the form of a simple integral which forms the object of equation (3). In its turn, this integral may be expressed as the difference between the mean value of $z_h$ for the holes and the mean value of $z_e$ for the electrons, which is also written in equation (3) using the normal graphical convention for illustrating the mean value ($< >$).

By inserting the value of the double integral determined by equation (3) into Equation (2), one arrives at equation (4). The latter lets moreover the surface S of the sample appear perpendicular to its axis of growth. The expression $\Delta v$ thus obtained in equation (4) is comparable to the ratio of one charge Q to one capacitance C, which is a mathematical justification of the arguments set out above with reference to FIG. 3B.

Taking the symmetry of wave functions into consideration, it may also be shown that the difference between the mean values of $z_h$ and $z_e$ may be defined by the equation (5), where $p_e$ and $p_h$ are, respectively, the probability for the electrons to be in the In As layer and the probability for the holes to be in the Ga Sb layer.

Thus, for example, one will consider a super-lattice having N=100 periods, for these In As layers whose thickness is 30 angstroms, while that of the Ga Sb layers is 50 angstroms. The determination of the wave functions yields a probability $p_e$ of approximately 0.7, and a probability $p_h$ of approximately 1. If a carrier density of $n = n_s/d = 10^{17}$ cm$^{-3}$ is injected, the potential difference $\Delta v$ at the terminals of the super-lattice as a whole is of the order of 200 millivolts.

The preceding considerations demonstrate the existence of a fresh photovoltaic effect, of a quantum origin, which is produced because of the localization of the wave functions and the absence of an overall symmetry of reflection along the axis of growth of the super-lattice.

It has, however, been noticed that this effect could not be observed under continuous illumination, because of the conductance of the super-lattice parallel to its axis of growth. One is thus, in point of fact, concerned with a transient effect governed by the time of recombination $\tau$ of the electron-hole pairs and also by the time constant RC of the electric circuit. This aspect will be returned to below.

Figure 5:
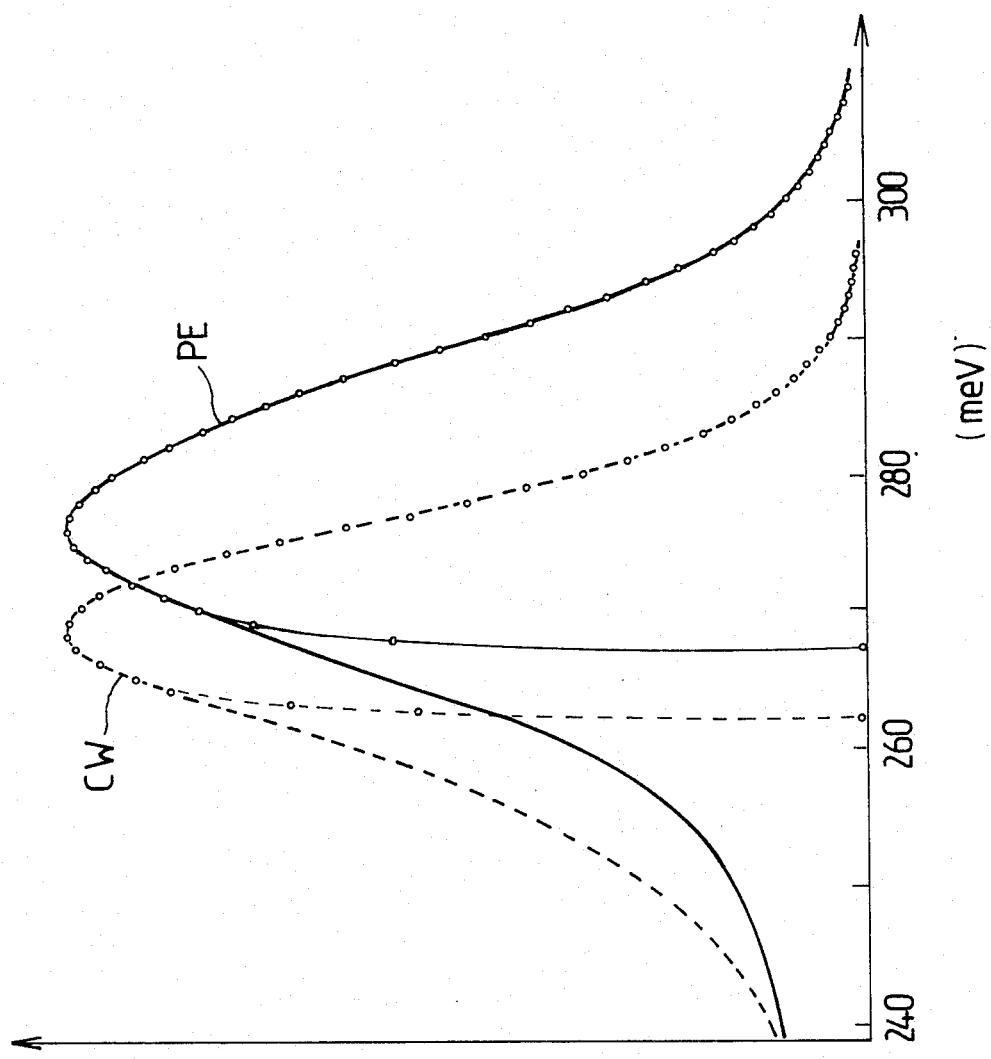
FIG. 5 is a diagram illustrating the intensity of luminescence in relation to the energy of the incident photons in meV, in a type II super-lattice in accordance with the invention.

Reference is now made to FIG. 5 illustrating the results of luminescence obtained in an In As/Ga Sb super-lattice subjected to strong photonic pulsed excitation.

An In As/Ga Sb super-lattice (30 angströms and 50 angströms) has been excited by a continuous wave krypton laser, then by an argon laser fitted with an acoustic-optic modulator and providing short pulses of approximately 20 nanoseconds at 150 nanojoules per pulse.

The excitation is effected far above the forbidden band of the sample and the dimension of the excited region on the super-lattice is typically 50 micrometers.

After various processing operations and corrections, one obtains the curves illustrated in FIG. 5, where the x-axis corresponds to the energy of the photons emitted in millielectronvolts (meV), while the y-axis defines the intensity of luminenscence in arbitrary units.

For the laser with a continuous wave (Curve CW) the luminescence spectrum consists of a single line centered on approximately 270 meV and comprising a low energy flank which tends to be saturated when the excitation level is increased.

The energy position of this line (as well as the dependence in relation to the excitation level, on the one hand, and the temperature of this luminescence line, on the other hand), does altogether favor an interpretation based on the band to band recombination of the electron-hole carriers. In other words, the dependence on temperature and the inventors' other observations tend to show that the luminescence observed is essentially of an intrinsic nature, in contrast to the more complex luminescence effects which can be due to impurities or other interference phenomena which are responsible for the low energy flank.

In comparison therewith, the high energy flank is relatively gentle, which indicates that the charge carriers have an effective temperature substantially higher than the temperature of the latice itself. The expert knows, in point of fact, that an analysis of quantum phenomena frequently leads to attributing a temperature to the charge carriers which is different from that of the crystal lattice containing them.

Now the PE curve will be observed which corresponds to the excitation of the super-lattice by short pulses as indicated above. Two observations were made at the time:

the luminescence line widens as the excitation level increases, which reflects the increase of the carrier density;

but, and this above all, this line is shifted as a whole towards the higher energies as will be seen by comparing the PE curve drawn in a solid line and the CW curve in dots and dashes.

It has thus been able to show that the gap of the forbidden band does effectively increase as the carrier density increases under pulsed excitation.

The shape of the band to band recombination line is that defined by equation (6) given in the Annex where:

h is Planck's constant $v$ is the frequency, $h_v$ being the energy of the photons;

q and dq are, respectively, the component of the wave vector of the super-lattice in direction z and its differential;

$f_e$ and $f_h$ are the Fermi distributions respectively relating to the electrons and the holes;

$\mu$ is the reduced mass of the electron-hole pair;

$m^*_e$ $m^*_h$ are, respectively, the effective masses of the electrons and of the heavy holes;

$E_g$ is the value of the gap of the forbidden band;

$\epsilon_z$ defining the profile of the basic conduction subband is equal to: $0.5 \Delta E (1+\cos qd)$; and $\Delta E$ here has the value of 60 meV.

It has also been observed that at a low temperature and at a high injection rate, the distribution of the electrons is degenerate. The theoretical profile of the line form is then very sensitive to the Fermi quasi-levels of the electrons, or which is tantamount to it, the carrier density. It is also very sensitive to the effective temperature of the carrier $T_e$. Apart from that, the low energy cut off value of the line form gives the value of the gap $E_g$ of the forbidden band $E_g$ of the super-lattice.

We then proceeded to a adaptation of this function on the spectrum obtained with a continuous excitation at 80 milliwatts (curve CW of FIG. 5). This gives a carrier density n of approximately $1.2 \cdot 10^{17}$ cm$^{-3}$, an effective temperature of 43° K., and a forbidden band gap $E_g$ of 262 meV.

Similarly, the spectrum PE obtained with ultra-short pulses of 150 nanojoules has formed the object of an adaptation giving $n = 2.1 \cdot 10^{17}$ cm$^{-3}$, $T_e = 55°$ K. and $E_g$ of 267 meV.

In a linear approximation, the variation of the forbidden band gap, depending on the carrier density under pulsed excitation, is obtained as:

$\Delta E_g$ (in meV) $= (4 \pm 1.5) \cdot 10^{-17} \cdot n$ (in cm$^{-3}$).

The present invention thus makes it possible to explain a variation which is much more important than that deriving from the known phenomenon of the periodic curving of the bands which is itself also associated with the spatial separation of the carriers. This latter effect, which also exists under continuous luminous excitation, may be evaluated by a perturbation method. For the example here considered, one would obtain a variation of the order of $9 \cdot 10^{-18} \cdot n$ in the same measurement units.

The experiments carried out by the assignees of this invention thus clearly demonstrate the existence of a transient photovoltaic effect which is substantially of the same order as the voltage $\Delta v$ which is observed from layer to layer in the super-lattice.

Although the phenomena are not yet completely explored, it does indeed seem that this modification of the forbidden band under pulsed excitation is due to a modification of the shape of the quantum wells and of the tunnel effect produced between them under the electric field effect produced by the photo-voltaic voltage. As a consequence, the confinement energies, on the one hand, and the width of the conduction band are affected and therefore the band structure of the super-lattice.

The preceding considerations suppose that two conditions have been met in the super-lattice:

the first is that there exists a spatial separation of the charge carriers, which is true as regards all type II super-lattices;

the second stipulates the existence of an overall assymmetry in direction z of the axis of growth.

This second condition may be met in that the overall structure is non-symmetrical, that is to say, that it possesses the same number N of In As and Ga Sb layers. One may apply the simple approximation of the capacitances as illustrated in FIG. 3B. The symmetry of the basic states of the wave functions of the electrons [and] of the holes implies that the mean values of $z_e$ and of $z_h$ are, respectively, at the centers of the In As and Ga Sb layers. One may then write the relation (7).

This relation is also obtained by combining the equations (1), (4) and (5).

But in reality, because of the absorption of light, the density of the injected carriers is not homogeneous along the axis of growth of the super-lattice. This absorption effect may be described in a simple way: the intensity of the incident beam decreases by a factor $\exp(-\alpha d)$ at each super-lattice period, and the density of the injected carriers is proportional to this absorbed intensity. There follows therefrom the new expression of equation (8). For an absorption of photons whose energy is close to the absorption threshold (forbidden band), and for the above mentioned sample (In As-Ga Sb; 30-50 Å), the coefficient $\alpha d$ is approximately $10^{-3}$. As a result, the photovoltaic effect will normally be saturated when the number of periods of the super-lattice reaches a value of the order of 1,000.

However, the spatial separation of the charges and the absorption coefficient counteract each other. At low values of the forbidden band, the absorption coefficient is much smaller.

Moreover, this absorption effect may contribute, by way of supplementing the asymmetry already noted, or by replacing the latter, to providing the overall asymmetry of inversion (or of reflection) which is necessary, as has already been mentioned.

We shall now return, referring to FIGS. 6A and 6B to the time parameters of the transient photovoltaic effect.

The surface carrier density $n_s$ and the overall photovoltaic voltage $\Delta v$ are governed by the operation of two dynamic equations (9) and (10).

In these equations, G designates the generation rate of the electron-hole pairs, $\tau$ designates the time of recombination of the electron-hole pairs, and RC designates a time constant of the electric circuit to which reference will be made below.

The recombination time $\tau$ (which is typically less than one nanosecond in the case of the sample considered), governs the concentration of the carriers in the mass of the super-lattice sample. Conversely, the time constant RC describes the relaxation of the photo-voltaic voltage, which corresponds to a net transfer of charges between the end planes of the super-lattice in relation to the z axis.

This time constant RC may be due solely to the conduction of the super-lattice parallel to its axis of growth; it may also be imposed by an external circuit, if the latter provides a discharge gap whose own time constant is smaller. It may also vary from the range of values below a nanosecond to that of the values comprised between a microsecond and a millisecond.

Figure 6A:
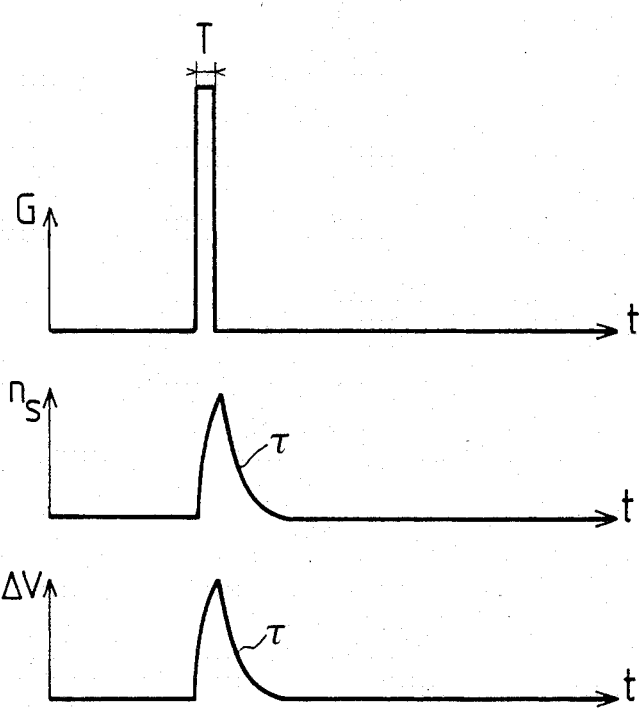
FIGS. 6A and 6B are two schematic illustrations of the photovoltaic response of a super-lattice in accordance with the invention.

Two cases may then arise:

FIG. 6A illustrates the excitation of the super-lattice by a very short light pulse (of duration T), comprising successively an ascending transition and a descending transition, both being very abrupt. This is defined by the curve G (RC>$\tau$>T).

The density of the injected carriers $n_s$ follows the shape of the curve G but taking the recombination time $\tau$ of the carriers into account. This also applies to the photo-voltaic voltage $\Delta V$ generated at the terminals of the lattice since no macroscopic relaxation effect had time to materialize.

Figure 6B:
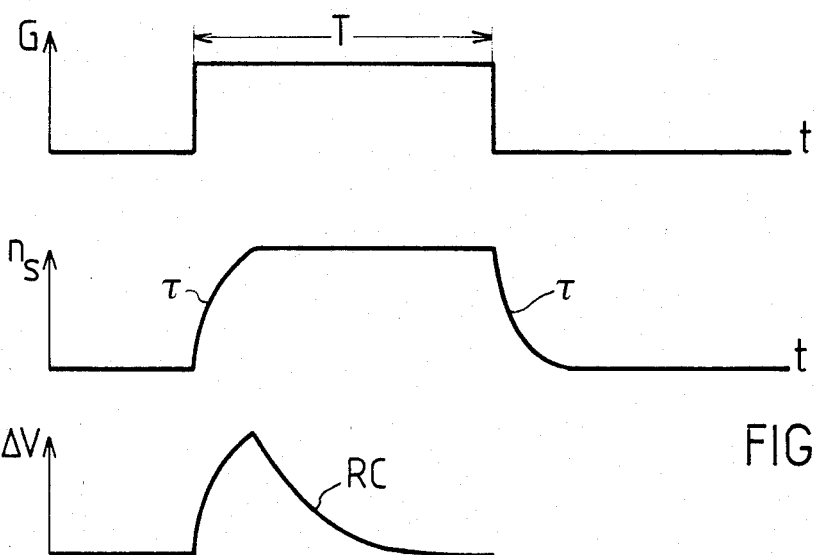

In FIG. 6B, the photonic pulse excitation assumes a crenellated shape as illustrated by curve G with the condition of $T > RC > \tau$. The density of the injected carriers $n_s$ then follows the ascending transition with a time constant related to the recombination time $\tau$. This density $n_s$ then follows its maximum to redescend with the same time constant $\tau$ during the descending transition of the curve G. For its part, the overall photo-voltaic voltage $\Delta V$ will also have a rising front which is related to that of the carrier density $n_s$ by an exponential law. While $n_s$ is at its maximum, $\Delta V$ redescends with an exponential time constant RC as far as zero. As the $n_s$ redescends, $\Delta V$ then assumes negative values, defined as the symmetrical value of its initial rise. Finally, $\Delta V$ returns to the zero value with a time constant RC' which may be different from RC.

The two time constants are somewhat different when they are solely due to the super-lattice itself. It will, in point of fact, be understood that the super-lattice is not conductive in the same way when it contains a high density of carriers as with hardly any.

But, as has already been noted, it is possible to shorten the two time constants RC and RC' which then become substantially equal if the discharge of the overall capacitor present at the terminals of the super-lattice is linked with shorter time constants appertaining to an external circuit.

Of course, in the completely opposite situation where the time constant RC would be far lower than the recombination time $\tau$, there would not appear any photo-voltaic voltage whatsoever with the illumination conditions, because the system would then substantially assume a conducting mode.

Figure 7:
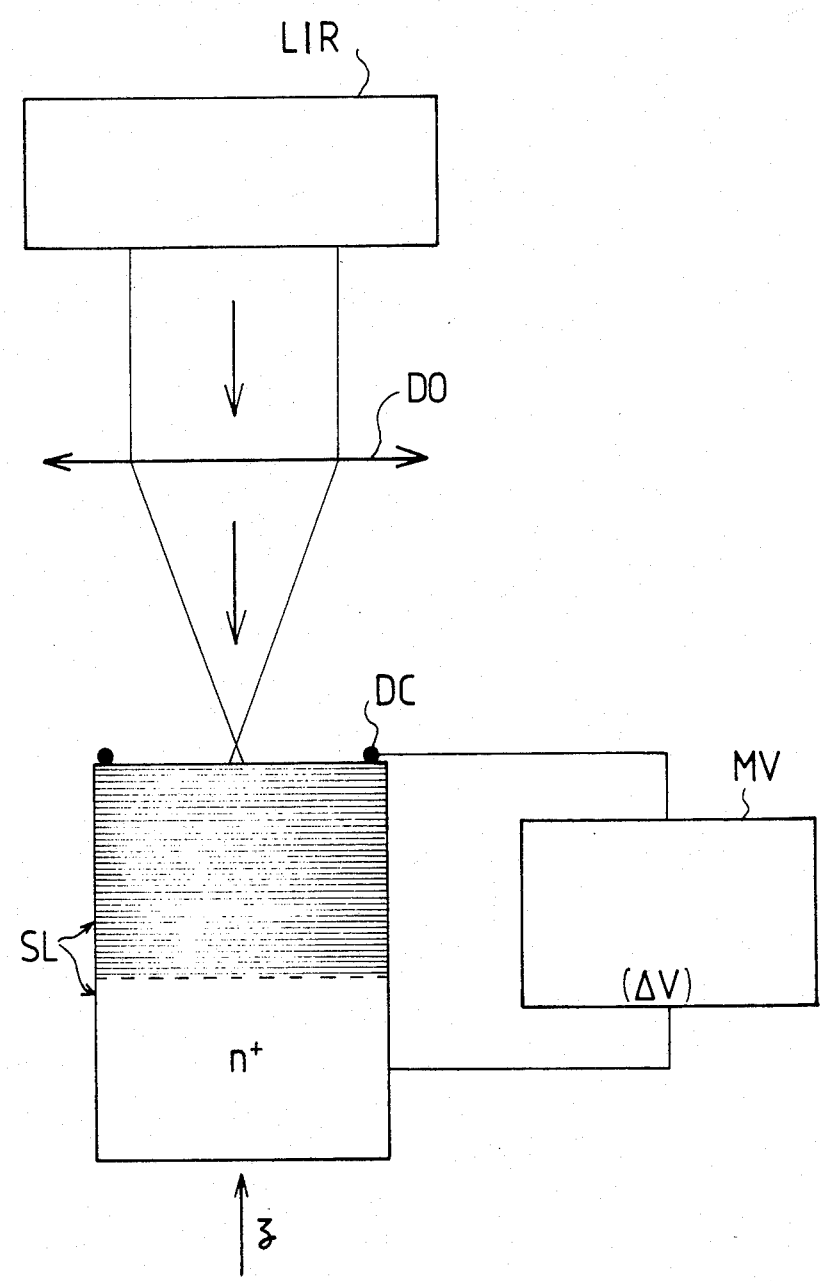
FIG. 7 is a schematic diagram of a photovoltaic device with a type II super-lattice in accordance with the invention.

The transient photo-voltaic phenomenon, in accordance with the present invention, may be observed by means of the experimental device illustrated in FIG. 7, by way of example.

A laser with ultra short pulses LIR operating in the infrared range, illuminates an optical device focussing the beam on the super-lattice SL obtained by growth on a substrate N+ of gallium arsenide, the direction of growth being designated as above.

A contact device DC is placed on the upper face of the super-lattice, for instance, in the form of a silver base lacquer. A lower contact is then effected on the substrate N+. A device MV measuring the voltage pulses may then be connected between these two contacts.

With an In As super-lattice having 100 periods with layer thicknesses of 30 angströms, and 50 angströms respectively, and a density of injected carriers $n = n_s/d$ of approximately $10^{17}$ cm$^{-3}$, there is obtained a photo-voltaic voltage which can reach a few hundreds of millivolts, e.g. about 0.2 V, depending upon the electricl characteristics of the device (including the measuring instrument). It has been observed that the electrical characteristics of the substrate, notably its conductivity, have a major influence on the amplitude of the measured signal.

Another experiment has been made with a superlattice InAs/GaSb (thickness 30 angströms for both). At the temperature of liquid helium, the overall resistance, substrate+sample, was about 1500 ohms. A signal of about 5 mV has been obtained across a load resistance of 50 Ohms.

The super-lattices of the type termed "nipi" also have the property of an alternate spatial localization of the electrons and holes along their axis of growth. Although it has not yet been possible to verify this completely, it is considered that such type II super-lattices also possess the transient photovoltaic effect in accordance with the invention.

ANNEX $$\Delta V = N \cdot \Delta v \tag{1}$$

$$\Delta v = \frac{e \cdot n_s}{\epsilon \cdot \epsilon_0} \int_{z_n}^{z_{n+1}} dz \int_{z_n}^{z} dz' [|\psi_e(z')|^2 - |\psi_h(z')|^2] \tag{2}$$

$$\int_{z_n}^{z_{n+1}} \ldots = -\int_{z_n}^{z_{n+1}} dz\, z [|\psi_e(z)|^2 - |\psi_h(z)|^2] \tag{3}$$

$$= \langle z_h \rangle - \langle z_e \rangle$$

$$\Delta v = n_s \cdot S \cdot e \cdot \frac{\langle z_h \rangle - \langle z_e \rangle}{\epsilon_0 \epsilon S} = \frac{Q}{C} \tag{4}$$

$$\langle z_h \rangle - \langle z_e \rangle = 0.5(p_e + p_h - 1) \cdot d \tag{5}$$

$$L(h_\nu) = (h_\nu)^2 \int_0^\eta dq \cdot M(q) f_e\left(\frac{\mu}{m_e^*}(h_\nu - E_g - \epsilon_z) + z\right) \tag{6}$$

$$f_h\left(\frac{\mu}{m_h^*}(h_\nu - E_g - \epsilon_z)\right)$$

$$\Delta V = \frac{N e n_s d}{2 \epsilon \epsilon_0}(p_e + p_h - 1) \tag{7}$$

$$\Delta V = \frac{e \cdot n_s \cdot d}{2 \epsilon \epsilon_0}(p_e + p_h - 1) \left| \frac{1 - \exp[-(N+1)\alpha d]}{1 - \exp(-\alpha d)} \right| \tag{8}$$

$$\frac{dn_s}{dt} = G - \frac{n_s}{\tau} \tag{9}$$

$$\frac{d \Delta V}{dt} = \frac{4\pi e N}{\epsilon \epsilon_0}(\langle z_h \rangle - \langle z_e \rangle)\frac{dn_s}{dt} - \frac{\Delta V}{RC} \tag{10}$$

We claim:

1. A method for detecting a very short temporal variation in a beam of electromagnetic radiation, including the steps of:
   (a) applying said beam to a super-lattice of type II in a direction along its axis of growth, said super-lattice responding to said temporal variation by a photovoltaic effect thereby generating a voltage difference within said super-lattice along said axis of growth thereof; and
   (b) sensing variations of said voltage difference between opposite sides of the super-lattice along said axis of growth.

2. A method according to claim 1, wherein the super-lattice is a composite super-lattice.

3. A method according to claim 1, wherein the super-lattice is formed of one of the group comprising semiconductor compounds III, IV and V, and alloys thereof.

4. A method according to claim 2, wherein the super-lattice is a periodic laminant of layers of first and second different compounds having first and second thicknesses chosen so that the lower limit of the conduction band of said first compound is lower than the upper limit of the valence band of the second compound.

5. A method according to claim 4, wherein one of said first and second compounds comprises indium arsenide and the other of said compounds comprises gallium antimonide.

6. A method according to claim 5, wherein one of said first and second compounds is indium arsenide and the other of said first and second compounds is gallium antimonide.

7. A method according to claim 6, wherein said first and second thicknesses are less than about 300 angströms.

8. A method according to claim 7, wherein said first and second thicknesses are less than about 200 angströms.

9. A method according to claim 6, wherein the thicknesses of the layers of at least one of said first and second compounds are substantially equal.

10. A method according to claim 9, wherein the thicknesses of the indium arsenide layers are about 30 angströms and the thicknesses of the layers of gallium antimonide are about 50 angströms.

11. A method according to claim 6, wherein the indium arsenide is doped N, while the gallium antimonide is doped P, both dopings being close to the residual dopings of indium arsenide and gallium antimonide.

12. A method according to claim 4 wherein the laminate comprises approximately 100 pairs of layers for a total thickness of a few micrometers along the axis of growth.

13. A method according to claim 1, wherein the super-lattice has an overall asymmetry of reflection along its growth axis relative to the incident beam of electromagnetic radiation.

14. A method according to claim 13, wherein the super-lattice comprises an integral number of spatial periods.

15. A method according to claim 13, wherein said overall asymmetry of reflection is at least partly due to the absorption of light in the layers of the super-lattice.

16. Means for detecting a temporal variation in a beam of electromagnetic radiation, said means comprising:
(a) a super-lattice of type II having an axis of growth, said super-lattice responding to said temporal variation by a photovoltaic effect thereby generating a voltage difference therein along said axis of growth;
(b) means for focusing an incident beam of electromagnetic radiation so that it is propagated substantially along said axis of growth of the super-lattice; and
(c) measuring means for measuring a transient potential difference between opposite sides of the super-lattice along said axis of growth.

17. Detection means according to claim 16, wherein said super-lattice is formed on a conductive substrate.

18. Detection means according to claim 16, wherein an impedance of the measuring means is selected in view of a desired value of the time constant of a trailing edge of said transient potential difference.

19. Detection means according to claim 16, wherein said super-lattice is a composite super-lattice made of at least a first compound having a conduction band and a second component having a valence band, said conduction and valence bands overlapping each other, and wherein the super-lattice has a spatial periodicity chosen so as to make it sensitive to a predetermined band of wavelengths of the incident radiation.

* * * * *